(12) United States Patent
Schwoerer

(10) Patent No.: US 7,907,029 B2
(45) Date of Patent: Mar. 15, 2011

(54) MODULATOR

(75) Inventor: Christoph Schwoerer, Grassbrunn (DE)

(73) Assignee: Intel Mobile Communications Technology GmbH, Neubiberg (DE)

( * ) Notice: Subject to any disclaimer, the term of this patent is extended or adjusted under 35 U.S.C. 154(b) by 400 days.

(21) Appl. No.: 12/075,364

(22) Filed: Mar. 11, 2008

(65) Prior Publication Data
US 2009/0231053 A1    Sep. 17, 2009

(51) Int. Cl.
*H03C 1/00* (2006.01)
*H03C 1/02* (2006.01)

(52) U.S. Cl. .......................... 332/149; 332/159

(58) Field of Classification Search ............... 332/115, 332/116, 149, 151–154, 159–162; 375/300; 455/39, 46, 47
See application file for complete search history.

(56) References Cited

U.S. PATENT DOCUMENTS

| | | | |
|---|---|---|---|
| 4,092,639 A | 5/1978 | Schoeff | |
| 5,508,702 A | 4/1996 | Estrada et al. | |
| 5,585,751 A * | 12/1996 | Iizuka | 327/113 |
| 6,615,027 B1 * | 9/2003 | Sahota et al. | 455/91 |
| 7,187,909 B2 * | 3/2007 | Lin et al. | 455/91 |
| 2006/0160499 A1 * | 7/2006 | Puma | 455/116 |

FOREIGN PATENT DOCUMENTS

| | | |
|---|---|---|
| GB | 2308032 A | 6/1997 |
| WO | 2008/077235 A1 | 7/2008 |

* cited by examiner

*Primary Examiner* — David Mis
(74) *Attorney, Agent, or Firm* — SpryIP, LLC

(57) ABSTRACT

A modulator includes a first converter, a second converter and a mixer. The first converter is configured to receive a first bit and provide a first current that is a function of the first bit. The second converter is configured to receive a second bit and provide a second current that is a function of the second bit. The mixer is configured to receive an input current that is a sum of the first current and the second current and a frequency signal and provide an output signal that is a function of the input current and the frequency signal.

11 Claims, 4 Drawing Sheets

MODULATOR

BACKGROUND

Modulators are used for signal transmission in wireless or wireline communication systems. One of the functions of a modulator is to modulate information onto a carrier frequency signal in order to provide a transmission signal. The transmission signal is amplified before being provided to a transmission channel.

In typical transmitters, digital baseband information that is to be transmitted is first converted by a digital-to-analog converter (DAC) into analog information. The DAC may be an R-string or a current steering DAC. In order to attenuate the out-of-band quantization noise of the DAC, the output of the DAC is provided to a resistor-capacitor (RC) filter. The output of the RC filter is converted into a current by a voltage/current converter. The current is applied to the source of a multiplier-based differential up-conversion mixer pair. The gates of the mixer pair are driven by a frequency signal provided by a local oscillator (LO). The frequency signal is chosen to be at the desired radio frequency of the transmitter. This approach requires that the voltage/current converter have high linearity which tends to increase the power consumption of the transmitter. That is, as the linearity requirement for the voltage/current converter increases, the quiescent current of the transistors within the converter with respect to the modulated current increases. High linearity for the voltage/current converter can be difficult to achieve if the transistors have non-linear characteristics.

For these and other reasons there is a need for the present invention.

BRIEF DESCRIPTION OF THE DRAWINGS

The accompanying drawings are included to provide a further understanding of the invention and are incorporated in and constitute a part of this specification. The drawings illustrate the embodiments of the invention and together with the description serve to explain the principles of the invention. Other embodiments of the invention and many of the intended advantages of the invention will be readily appreciated as they become better understood by reference to the following detailed description. Like reference numerals designate corresponding similar parts.

DETAILED DESCRIPTION

Figure 1:
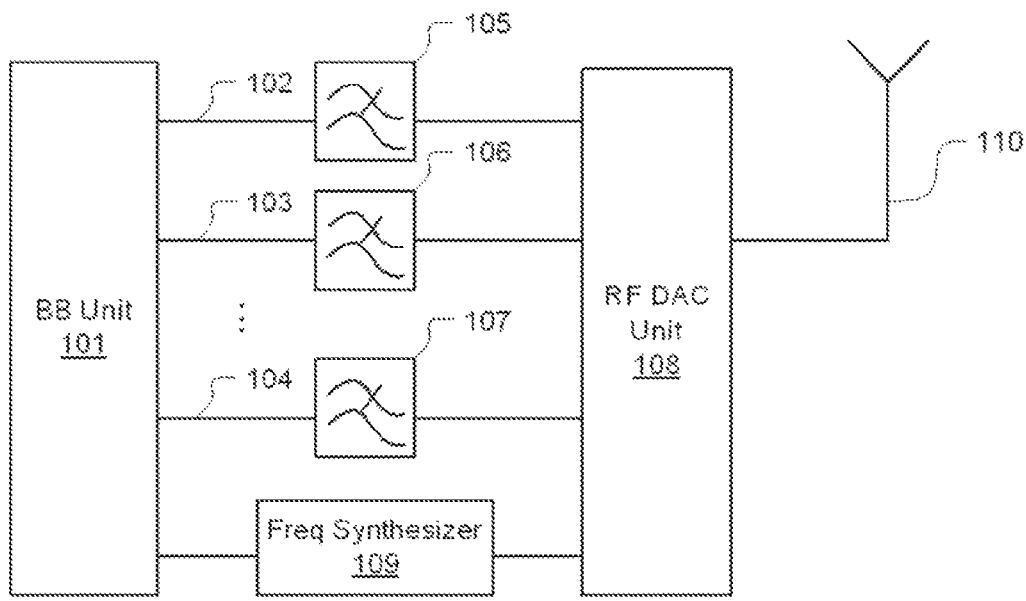
FIG. 1 illustrates one embodiment of a transmitter that comprises a RF DAC.

FIG. 1 illustrates one embodiment of a transmitter that includes a RF DAC. The transmitter includes a baseband unit 101 that provides data to be transmitted in the form of a digital word that comprises one or more bits. The data is provided to a digital interface that includes a first signal line 102, a second signal line 103, and a third signal line 104. Each signal line provides a bit of the digital word. A bit is provided via the first signal line 102 to a first low-pass filter 105. An output of the first low-pass filter 105 is provided to a RF DAC unit 108. A bit is provided via the second signal line 103 to a second low-pass filter 106. An output of the second low-pass filter 106 is provided to the RF DAC unit 108. A bit is provided via the third signal line 104 to a third low-pass filter 107. An output of the third low-pass filter 107 is provided to the RF DAC unit 108. In other embodiments, any suitable number of signal lines and/or low-pass filters may be used to provide more or fewer bits of the digital word to the RF DAC unit 108. In one embodiment, the total number of bits depends on the size of the digital word. In one embodiment, the digital word has a size of 8 bits or one byte. In other embodiments, the size is defined by the accuracy needed to transmit information.

In the illustrated embodiment, the transmitter includes a frequency synthesizer 109. In various embodiments, frequency synthesizer 109 may comprise a phase locked loop (PLL), a voltage controlled oscillator (VCO) or a ring oscillator. In other embodiments, frequency synthesizer 109 may comprise a phase synthesizer, or an implementation of an analog PLL or a digital PLL. In the illustrated embodiment, the frequency synthesizer 109 is coupled between the baseband unit 101 and the RF DAC unit 108.

RF DAC unit 108 is coupled to an output medium 110. In the embodiment illustrated in FIG. 1, the output medium 110 is an antenna. The transmitter in various embodiments may be used in wireless, wireline, cordless, or radio data transmission applications. In other embodiments, the output medium 110 may be a coupler or a contact that is connectable to a transmission line, such as a copper wire or an optical waveguide.

In the embodiment illustrated in FIG. 1, the transmitter is a polar transmitter using polar modulation for a transmission signal. The baseband unit 101 provides amplitude information for useful data that is provided as a digital word. The baseband unit 101 further provides phase information that is provided to the frequency synthesizer 109. In various embodiments of frequency synthesizer 109, the phase information may be provided as a digital word or as analog information. In the illustrated embodiment, the amplitude information and the phase information are combined by the RF DAC 108. The RF DAC 108 comprises a plurality of segments that each receive a respective bit of the amplitude information. In the illustrated embodiment, all segments within RF DAC 108 receive an output of the frequency synthesizer 109. In other embodiments, any suitable number of segments may receive an output of the frequency synthesizer 109.

Figure 2:
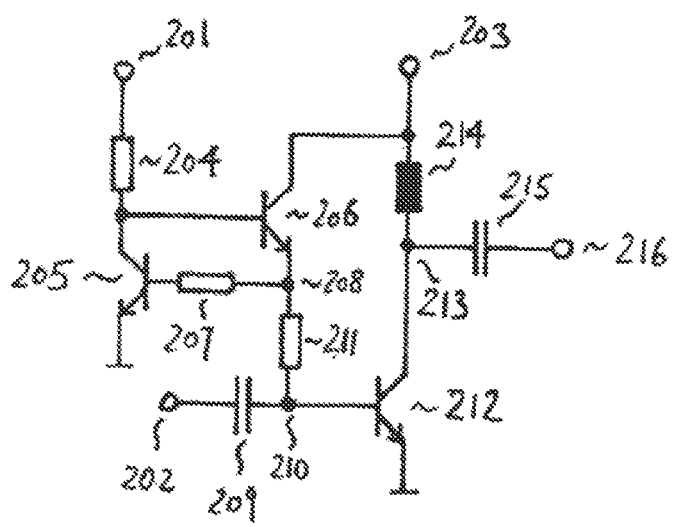
FIG. 2 illustrates one embodiment of a segment of the RF DAC.

FIG. 2 illustrates one embodiment of a segment of the RF DAC 108. The segment includes a first input terminal 201 that receives an output from one of low-pass filter 105, 106 or 107. The segment includes a second input terminal 202 that receives an output from the frequency synthesizer 109. In addition, the segment includes a third input terminal 203 that is coupled to a supply voltage VDD.

In the illustrated embodiment, the first input terminal 201 is coupled via a first resistor 204 to a collector terminal of a first transistor 205. An emitter terminal of the first transistor 205 is grounded. The resistor 204 and the collector terminal of the first transistor 205 are further coupled to a base terminal of a second transistor 206. A base terminal of the first transistor 205 is coupled via a second resistor 207 to a first node 208. An emitter terminal of the second transistor 206 is coupled to the first node 208. A collector terminal of the second transistor 206 is coupled to the third input terminal 203.

In the illustrated embodiment, the second input terminal 202 is coupled via a first capacitor 209 to a second node 210. The first node 208 is coupled via a third resistor 211 to the second node 210. The second node 210 is further coupled to a base terminal of a third transistor 212. An emitter terminal of the third transistor 212 is grounded. A collector terminal of the third transistor 212 is coupled to a third node 213. The third node 213 is coupled via an inductor 214 to the third input terminal 203. Furthermore the third node 213 is coupled via a second capacitor 215 to an output terminal 216.

The function of the segment may be illustrated as follows. The output of the low-pass filter received at the first input 201 is converted via the first resistor 204 into a first current through the first transistor 205. The first current is copied by means of the second transistor 206 into the third transistor 212. The low frequency current through the third transistor 212 is modulated with a local oscillator signal, i.e. the output of the frequency synthesizer received at the second input 202 via the non-linear characteristic of the third transistor 212. The first capacitor 209 ensures an AC coupling, i.e. a suppression of a DC portion of the output of the frequency synthesizer 109. The ratio between the gain of first transistor 205 and gain of the third transistor 212 depends on a weight that a respective bit fed to the segment has in the digital word. The weight corresponds to a position of a bit in a respective digital word.

The outputs of the different segments are added up to provide a transmission signal from the transmitter shown in FIG. 1. Thus, within the RF DAC 108, the outputs of the low-pass filters, i.e. the first low-pass filter 105, the second low-pass filter 106, and the third low-pass filter 107, are bit-wise converted into currents. Each of the currents drives a controlled current source. As the current sources are sized as a function of the weight of respective bits in the digital word, the sum of all outputs of the segments are representative of the digital signal after conversion into an analog format and are modulated on a carrier frequency.

Figure 3:
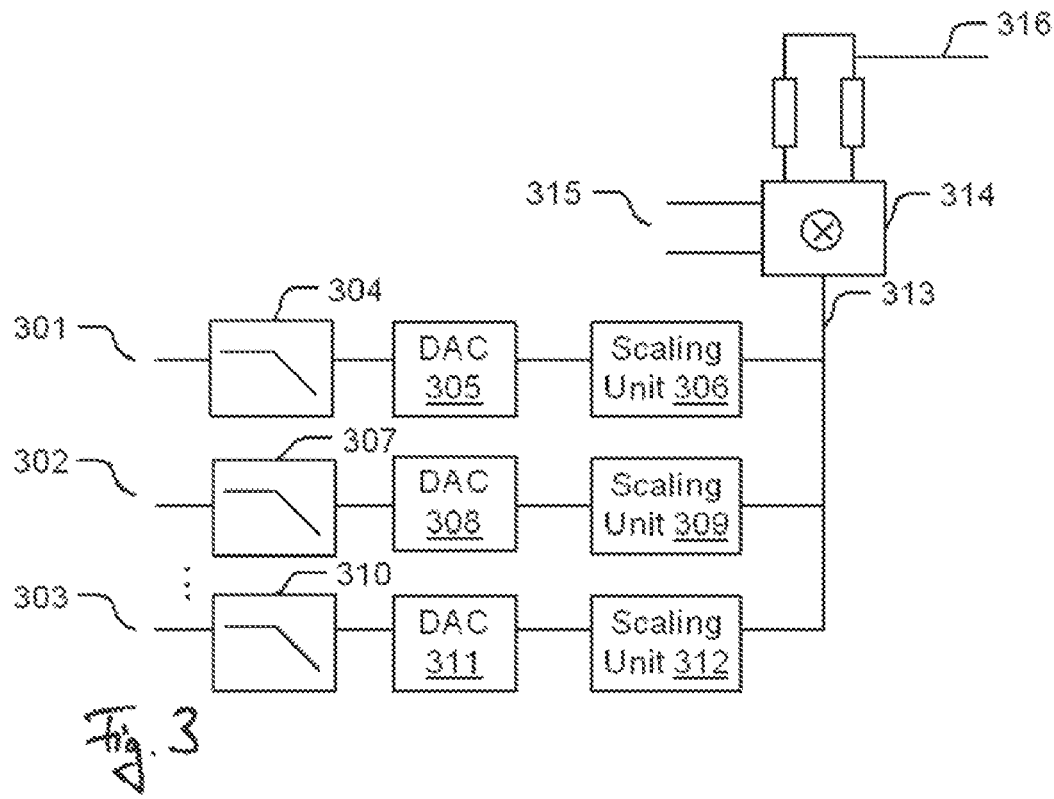
FIG. 3 illustrates one embodiment of a modulator.

FIG. 3 illustrates one embodiment of a modulator. In various embodiments, the modulator is a converter that includes one or more channels wherein each channel includes one or more of a low-pass filter, a DAC or a scaling unit. In the illustrated embodiment the modulator includes a digital interface having a first input terminal 301, a second input terminal 302, and a third input terminal 303. The first input terminal 301 is coupled via a first low-pass filter 304 and a first DAC 305 to a scaling unit 306. The second input terminal 302 is coupled via a second low-pass filter 307 and a second DAC 308 to a scaling unit 309. The third input terminal 303 is coupled via a third low-pass filter 310 and a third DAC 311 to a scaling unit 312. In one embodiment, the first scaling unit 306, the second scaling unit 309, and the third scaling unit 312 may each be realized as a current mirror scaling an output current of a respective current according to the weight of a bit within the digital word. In one embodiment, the first scaling unit 306 scales the current by a ratio of $1:2^0$, the second scaling unit 309 scales the current by a ratio of $1:2^1$, and the third scaling unit 312 scales the current by a ratio of $1:2^n$. The number n indicates a number of bits of the digital word. In one embodiment, the first scaling unit 306 provides a current representative of the most significant bit (MSB) of the digital word while the third scaling unit 312 provides a current representative of the least significant bit (LSB) of the digital word.

The outputs of the first scaling unit 306, the second scaling unit 309, and the third scaling unit 312 are respectively coupled to a node 313. The total current provided to node 313 is the sum of the outputs of the first scaling unit 306, the second scaling unit 309, and the third scaling unit 312. The node 313 is connected to an input of a mixer 314. The mixer 314 has a differential input 315 that can receive a carrier frequency signal. The mixer 314 modulates the total current on the frequency signal and provides a modulated signal at an output 316. In other embodiments, other suitable architectures can be used for the modulator illustrated in FIG. 3. In other embodiments, other suitable numbers of bits, DACs and scaling units can be used.

Figure 4:
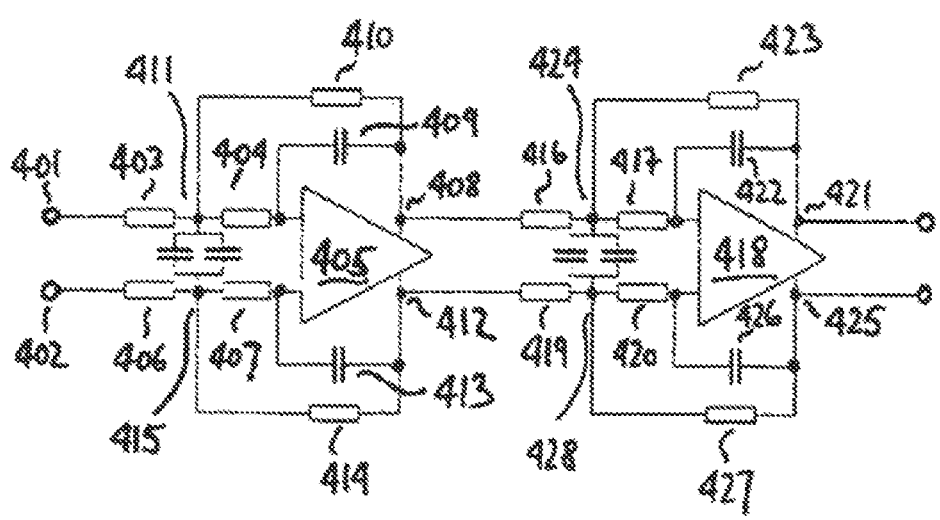
FIG. 4 illustrates one embodiment of a filter that can be used in a modulator.

FIG. 4 illustrates one embodiment of a filter that can be used in a modulator. The filter includes a first input 401 and a second input 402. The first input 401 is connected via a first resistor 403 and a second resistor 404 to a first differential input of a first amplifier 405. The second input 402 is connected via a third resistor 406 and a fourth resistor 407 to a second differential input of the first amplifier 405. A first differential output 408 of the first amplifier 405 is connected via a first capacitor 409 to the first differential input. The first differential output 408 is connected via a fifth resistor 410 to a first node 411 arranged between the first resistor 403 and the second resistor 404. A second differential output 412 of the first amplifier 405 is connected via a second capacitor 413 to the first differential input. The second differential output 412 is connected via a sixth resistor 414 to a second node 415 arranged between the third resistor 406 and the fourth resistor 407. The first node 411 and the second node 415 are coupled to each other by a pair of two capacitors connected in parallel. In one embodiment, first amplifier 405 in combination with the various feedback elements forms a first biquadratic integrator.

In the illustrated embodiment, the first differential output 408 is connected via a seventh resistor 416 and an eighth resistor 417 to a third differential input of a second amplifier 418. The second differential output 412 is connected via a ninth resistor 419 and a tenth resistor 420 to a fourth differential input of the second amplifier 418. A third differential output 421 of the second amplifier 418 is connected via a third capacitor 422 to the third differential input. The third differential output 421 is connected via an eleventh resistor 423 to a third node 424 arranged between the seventh resistor 416 and the eighth resistor 417. A fourth differential output 425 of the second amplifier 418 is connected via a fourth capacitor 426 to the fourth differential input. The fourth differential output 425 is connected via a twelfth resistor 427 to a fourth node 428 that is arranged between the ninth resistor 419 and the tenth resistor 420. The third node 424 and the second fourth node 428 are coupled to each other by a pair of two capacitors that are connected in parallel. In one embodiment, the second amplifier 418 in combination with the various feedback elements forms a second biquadratic integrator.

The filter in the embodiment illustrated in FIG. 4 is a fourth order filter composed of two biquadratic integrator filters that are implemented in a differential structure. In other embodiments, other structures or filters may be used such as lower order filters, single ended filters, or other suitable filter structures.

Figure 5:
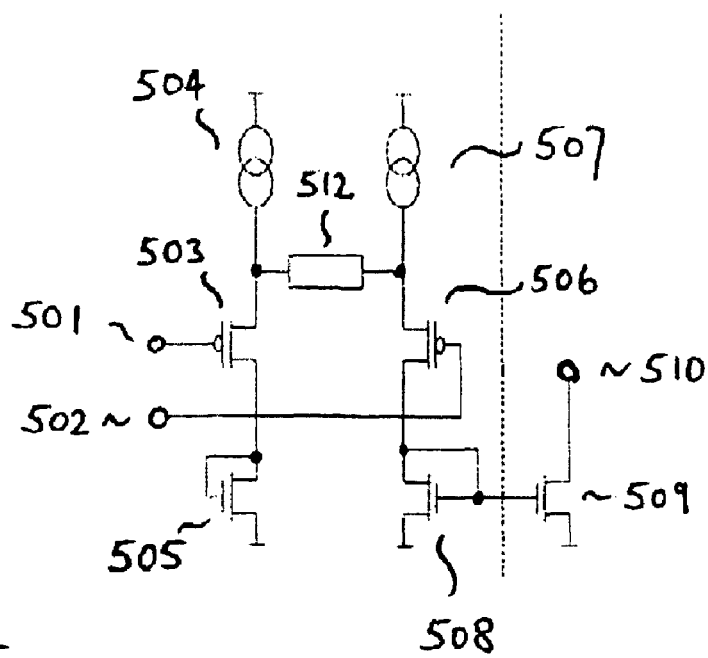
FIG. 5 illustrates one embodiment of a voltage/current converter that can be used in a modulator.

FIG. 5 illustrates one embodiment of a voltage/current converter that can be used in a modulator. The voltage/current converter includes a differential pair that includes a first input 501 and a second input 502. The first input 501 is connected to a gate terminal of a first PMOS transistor 503. A drain terminal of the first PMOS transistor 503 is connected to a first current source 504. A source terminal of the first PMOS transistor 503 is connected via a diode-connected enhancement transistor 505 to a ground terminal. The second input 502 is connected to a gate terminal of a second PMOS transistor 506. A drain terminal of the second PMOS transistor

506 is connected to a second current source 507. A source terminal of the second PMOS transistor 506 is connected via a diode-connected MOS transistor 508 to a ground terminal. A gate terminal of the MOS transistor 508 is connected to a gate terminal of a current output transistor 509. The diode-connected MOS transistor 508 and the current output transistor 509 form a current mirror.

A source terminal of the current output transistor 509 is grounded while a drain terminal of the current output transistor 509 is connected to a converter output 510. The drain terminal of the first PMOS transistor 503 and the drain terminal of the second PMOS transistor 506 are coupled together via a resistor 512. The first PMOS transistor 503 and the second PMOS transistor 506 form a differential pair. In one embodiment, the differential pair is degenerated by the resistor 512.

In one embodiment, the voltage/current converter is arranged as a modulator and a first voltage $V_1$ is an output voltage of the differential filter. In one embodiment, the output voltage from the filter shown in FIG. 4 is applied to the first input 501. In the illustrated embodiment, a second voltage $V_2$ is an output voltage of the differential filter. In one embodiment, the output voltage from the filter shown in FIG. 4 is applied to the second input 502. In the illustrated embodiment, if the inverse of the transconductance of the differential pair, i.e. the first PMOS transistor 503 and the second PMOS transistor 506, is much smaller than the resistance R of the resistor 512 separating the differential pair, a current through the MOS transistor 508 can be approximated as $$I = I_2 + \frac{V_1 - V_2}{R}. \quad (1)$$

The current $I_2$ is the current provided by the second current source 507.

The current I is mirrored to the current output transistor 509. The current mirror is arranged so that the current I is weighted as a function of the bit position in the digital word. If the voltage current converter is in a modulator path assigned to the $n^{th}$ bit of the digital word, the scaling will by $1:2^n$. In this embodiment the voltage/current converter comprises the scaling unit of the modulator.

Figure 6:
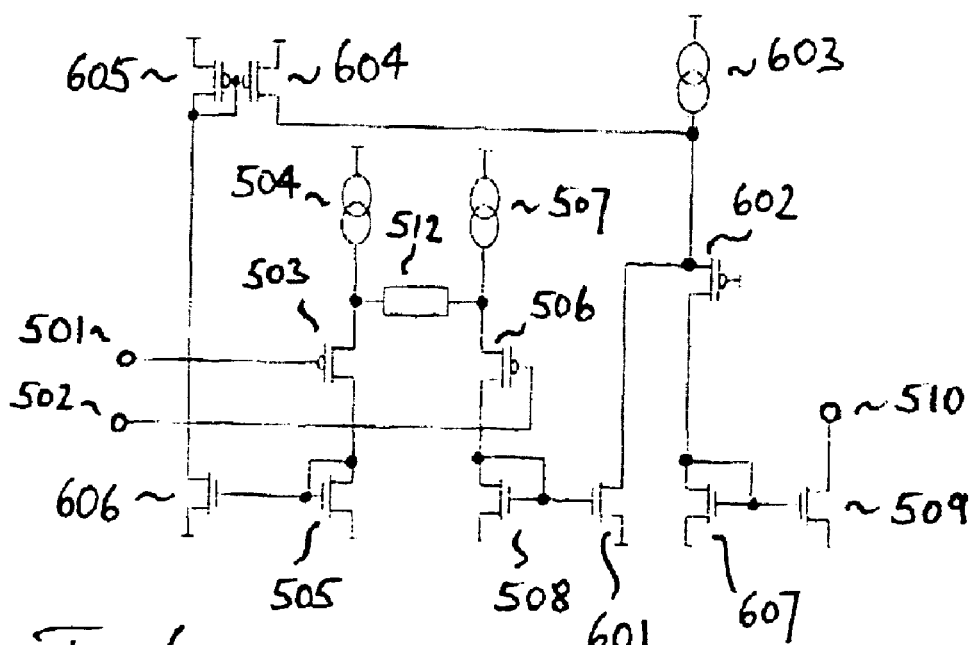
FIG. 6 illustrates one embodiment of a voltage/current converter that can be used in a modulator.

FIG. 6 illustrates one embodiment of a voltage/current converter that can be used in a modulator. For ease of illustration, elements having the same properties and function as those shown in FIG. 5 have the similar names and reference numerals. The embodiment illustrated in FIG. 6 includes a second MOS transistor 601 that has a gate terminal coupled to the gate terminal of the diode-connected MOS transistor 508. A source terminal of the second MOS transistor 601 is grounded. A drain terminal of the second MOS transistor 601 is coupled to a drain terminal of a third PMOS transistor 602. A gate terminal of the third PMOS transistor 602 is grounded. The drain terminal of the second MOS transistor 601 and the drain terminal of a third PMOS transistor 602 are coupled a third current source 603 and to a source terminal of a third MOS transistor 604. A drain terminal of the third MOS transistor 604 is grounded. A gate terminal of the third MOS transistor 604 is coupled to a gate terminal and a source terminal of a fourth MOS transistor 605. A drain terminal of the fourth MOS transistor 605 is grounded. The source terminal of the fourth MOS transistor 605 is connected to a drain terminal of a fifth MOS transistor 606, which has a source terminal that is grounded. A gate terminal of the fifth MOS transistor 606 is coupled to the gate terminal and the source terminal of the diode-connected enhancement transistor 505.

In this embodiment, the diode-connected MOS transistor 508 is not directly connected to the current output transistor 509 and is indirectly connected by the drain-source path of the third PMOS transistor 602 and a diode-connected sixth MOS transistor 607. The sixth MOS transistor 607 includes a drain terminal that is coupled to the source terminal of the third PMOS transistor 602. A source terminal of sixth MOS transistor 607 is grounded. The drain and gate terminals of sixth MOS transistor 607 are coupled to the gate terminal of the current output transistor 509.

In the illustrated embodiment, a current I mirrored through the current mirror formed by the diode-connected sixth MOS transistor 607 and the current output transistor 509 could be expressed as $$I = I_3 - \left(I_2 - \frac{V_n - V_p}{R}\right) + I_1 + \frac{V_n - V_p}{R}. \quad (2)$$

The current $I_1$ is the current provided by the first current source 504. The current $I_2$ is the current provided by the second current source 507. The current $I_3$ is the current provided by the second current source 603. The voltage $V_n$ is the voltage provided at the drain terminal of the first PMOS transistor 503. The voltage $V_p$ is the voltage provided at the drain terminal of the second PMOS transistor 506. If $I_1$ and $I_2$ are chosen to be equal the current I may be expressed as $$I = I_3 + 2\frac{V_n - V_p}{R}. \quad (3)$$

The current I is mirrored to the current output transistor 509. The current mirror is arranged so that the current I is weighted by a function of the bit position in the digital word. Thus, in one embodiment, if the voltage/current converter in a modulator path is assigned to the $n^{th}$ bit of the digital word, the scaling will be $1:2^n$. In this embodiment the voltage/current converter comprises the scaling unit of the modulator.

In one embodiment the output current is independent of a DC current through the differential pair, i.e. the pair that includes the first PMOS transistor 503 and the second PMOS transistor 506. The DC current may have a suitable magnitude to insure sufficient linearity for all output voltages provided by a filter at the first input 501 and the second input 502. The embodiment illustrated in FIG. 6 minimizes the generation of undesirable harmonics that may occur during conversion.

Figure 7:
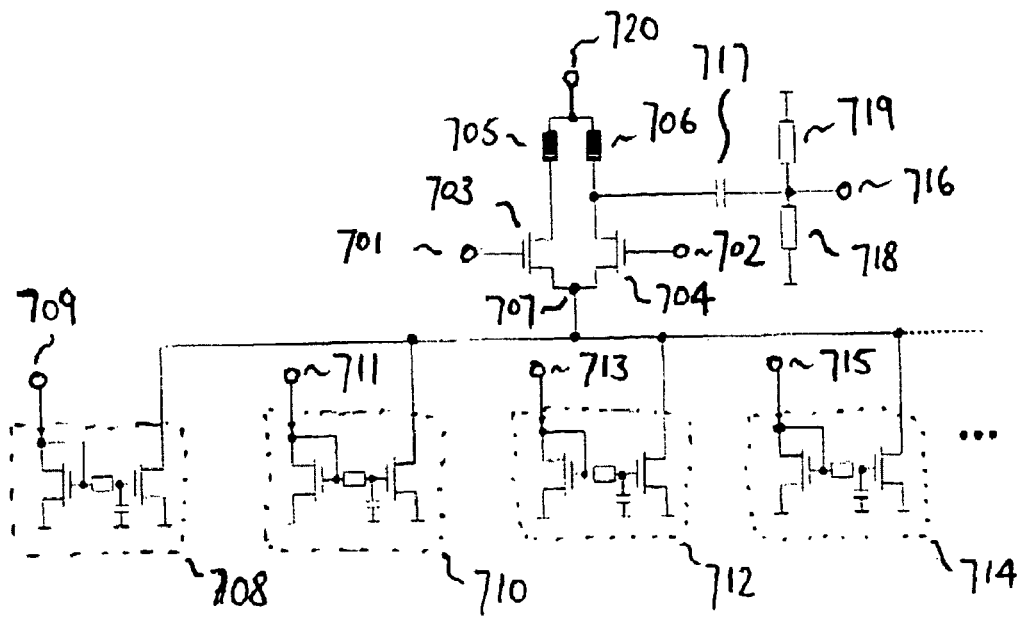
FIG. 7 illustrates one embodiment of an output driver that includes a single balanced mixer.

FIG. 7 illustrates one embodiment of an output driver that includes a single balanced mixer that can be used in a modulator. The mixer includes a differential input having a first input 701 and a second input 702 that can receive a local oscillator signal and a complement of the local oscillator signal. The local oscillator signal is provided in one embodiment by an oscillator not shown in FIG. 7. In various embodiments, the oscillator can be a voltage controlled oscillator (VCO), a digitally controlled oscillator (DCO), a quartz crystal oscillator, or any other suitable frequency synthesizer that can provide the local oscillator signal. The first input 701 is coupled to a gate terminal of a first transistor 703. The second input 702 is coupled to a gate terminal of a second transistor 704. A drain terminal of the first transistor 703 is coupled to a drain terminal of the second transistor 704 via a first inductor 705 and a second inductor 706. A node between the first inductor 705 and the second inductor 706 is coupled to a supply voltage terminal 720. The mixer includes a further input formed by a node 707 that is coupled to a source terminal of the first transistor 703 and to a source terminal of the second transistor 704.

In the embodiment illustrated in FIG. 7, the output driver includes a first driver 708 having a first input 709. The output driver further includes a second driver 710 having a second input 711, a third driver 712 having a third input 713, and a fourth driver 714 having a fourth input 715. In other embodiments, more or fewer drivers may be used. In the illustrated embodiment, all drivers have an output coupled to the node 707 to provide a total input signal that is the sum of the output currents provided by the drivers. The drivers are weighted according to the position of the bit in the respective input receivers. In one embodiment, these correspond to the scaling units shown in FIG. 3.

In the illustrated embodiment, the mixer includes an output 716 that is coupled to the source terminal of the second transistor 702 via a capacitor 717. The output 716 is also coupled to a voltage divider comprising a first resistor 718 and a second resistor 719. At the output 716, the mixer provides a high frequency signal that is a modulation of the total input signal provided by the output drivers on the local oscillator signal. In one embodiment, the signal is an RF signal.

Figure 8:
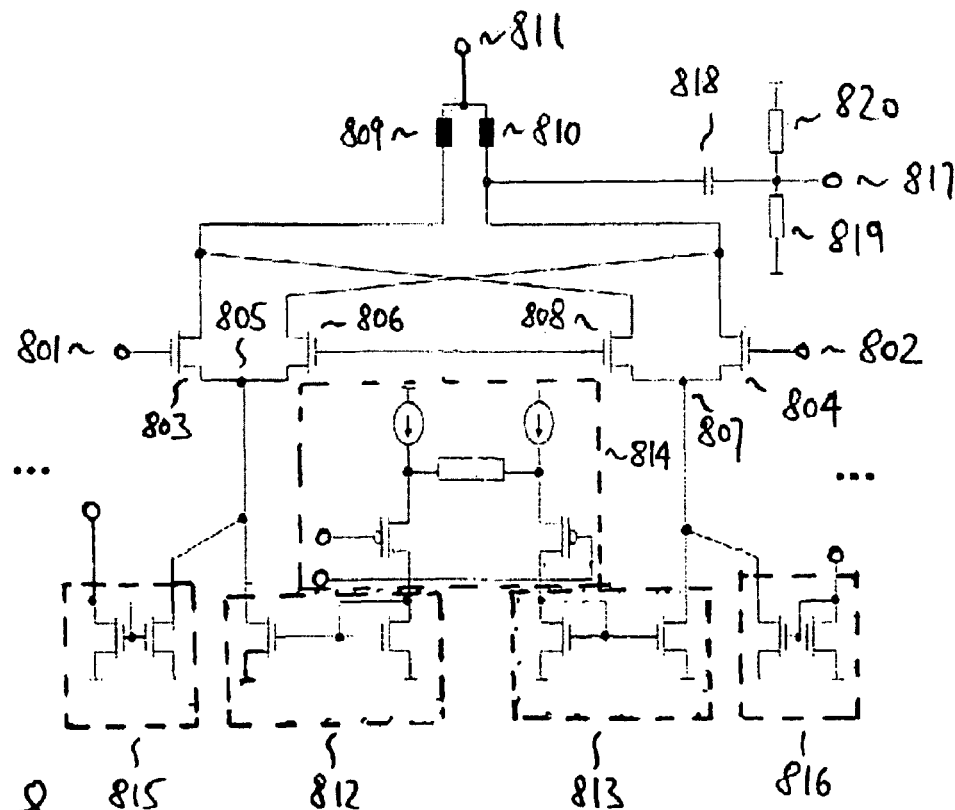
FIG. 8 illustrates one embodiment of an output driver that includes a fully balanced mixer that can be used in a modulator.

FIG. 8 illustrates one embodiment of an output driver with a fully balanced mixer that can be used in a modulator. The mixer includes a parallel input that includes a first input 801 and a second input 802 that both are adapted to receive a local oscillator signal. In analogy to the mixer shown in FIG. 7, the local oscillator signal is provided by an oscillator that is not shown in FIG. 8. The first input 801 is coupled to a gate terminal of a first transistor 803. The second input 802 is coupled to a gate terminal of a second transistor 804. A source terminal of the first transistor 803 is coupled to first node 805 and to a source terminal of third transistor 806. A source terminal of the second transistor 804 is coupled to second node 807 and to a source terminal of fourth transistor 808. A gate terminal of the third transistor 806 is coupled to a gate terminal of the fourth transistor 808. A drain terminal of the first transistor 803 is coupled to a drain terminal of the fourth transistor 808. A drain terminal of the third transistor 806 is coupled to a drain terminal of the second transistor 804. The drain terminal of the first transistor 803 is coupled to the drain terminal of the second transistor 804 via a first inductor 809 and a second inductor 810. A node arranged between the first inductor 809 and the second inductor 810 is coupled to a supply voltage terminal 811. A gate terminal of the third transistor 806 is coupled to a gate terminal of the fourth transistor 808. In the illustrated embodiment, the output driver shown in FIG. 8 includes a differential set of drivers for each bit of the digital word. FIG. 8 includes a pair of a first driver 812 and a second driver 813 coupled to a voltage/current converter 814 that receives a current and a complementary current representing the LSB of the digital word to be modulated. An output of the first driver 812 is coupled to the first node 805 and an output of the second driver 813 is coupled to the second node 807. FIG. 8 includes a second pair of a third driver 815 and a fourth driver 816 coupled to a voltage/current converter not depicted in FIG. 9 and that receives a current and a complementary current representing the next but less significant bit (LSB-1) of the digital word to be modulated. An output of the third driver 815 is coupled to the first node 805 and an output of the fourth driver 816 is coupled to the second node 807. In other embodiments, additional pairs of drivers may be provided that include outputs that are coupled to the first node 805 or the second node 807. In one embodiment, the pairs of drivers correspond to the scaling units shown in FIG. 3. In the illustrated embodiment, the drivers provide a total input signal at the first node 805 and a complementary total current signal at the second node 807 that are each the sum of the respective output currents provided by the drivers.

The mixer includes an output 817 that is coupled to the source terminal of the second transistor 802 via a capacitor 818. The output 817 is also connected to voltage divider comprising a first resistor 819 and a second resistor 820. In one embodiment, the mixer provides at the output 817 a high frequency signal that is a modulation of the total input signal provided by the output drivers on the local oscillator signal. In one embodiment the signal is an RF signal. In one embodiment the output driver shown in FIG. 8 is a fully balanced mixer. In one embodiment this implementation increases the LO suppression as compared to the output driver shown in FIG. 7. In one embodiment, this implementation can fully mix the digital word with the local oscillator signal to provide for the modulated RF signal.

Although the invention has been shown and described with respect to a certain embodiments, equivalent alterations and modifications will occur to others skilled in the art upon the reading and understanding of this specification and the annexed drawings. For example, although bipolar or CMOS technologies are used in various embodiments of the invention, in other embodiments, other suitable technologies can be used. In regard to the various functions performed by the above described components or circuits, terms used to describe such components are intended to correspond, unless otherwise indicated, to any component which performs the specified function of the described component (i.e., that is functionally equivalent), even though not structurally equivalent to the disclosed structure which performs the function in the exemplary embodiments of the invention. Terms such as "connected" should be interpreted to mean either directly connected or indirectly connected. Terms such as "coupled" should be interpreted to mean either directly coupled or indirectly coupled. Furthermore, to the extent that the term "includes" is used in either the detailed description or the claims, such term is intended to be inclusive in a manner similar to the term "comprising." While a particular feature of the invention may have been disclosed with respect to only one of several embodiments of the invention, such a feature may be combined with one or more other features of the other embodiments as may be desired and advantageous for any given or particular application.

What is claimed is:

1. A modulator comprising:
 a first converter configured to receive a first bit and provide a first current that is a function of the first bit, the first converter including a filter to filter the first bit;
 a second converter configured to receive a second bit and provide a second current that is a function of the second bit; and
 a mixer that is configured to receive an input current that is a sum of the first current and the second current and a frequency signal and provide an output signal that is a function of the input current and the frequency signal.

2. The modulator of claim 1, wherein the filter is an low-pass filter.

3. The modulator of claim 1, wherein the first converter comprises a voltage/current converter.

4. The modulator of claim 3, wherein the voltage/current converter comprises a current scaling unit.

5. The modulator of claim 4, wherein the current scaling unit comprises a current mirror.

6. The modulator of claim 1, wherein the mixer is a Gilbert mixer.

7. The modulator of claim 1, wherein the mixer is a fully-balanced mixer.

8. A radio frequency digital-to-analog converter comprising:
   a parallel input configured to receive a digital word having a plurality of bits;
   a plurality of voltage/current converters that are each configured to receive one of the plurality of bits and provide one of a plurality of corresponding currents, wherein at least one of the voltage/current converts is configured to filter a received bit;
   an adder that sums the plurality of corresponding currents; and
   a mixer that modulates a frequency signal as function of the sum of the plurality of corresponding currents.

9. A method for converting a digital word to a frequency signal, comprising:
   providing a digital word having at least a first bit and a second bit;
   converting the first bit to a corresponding first current, the converting of the first bit including filtering the first bit;
   converting the second bit to a corresponding second current; and
   summing at least the first current and the second current; and modulating a carrier frequency signal as function of the sum of the first current and the second current.

10. The method of claim 9, wherein converting the second bit to the corresponding second current comprises filtering the second bit.

11. The method of claim 9, wherein converting the first bit to the corresponding first current comprises scaling the first current according to a position of the first bit in the digital word, and wherein converting the second bit to the corresponding second current comprises scaling the second current according to a position of the second bit in the digital word.

* * * * *